(12) United States Patent
Xia et al.

(10) Patent No.: US 10,734,440 B2
(45) Date of Patent: Aug. 4, 2020

(54) DISPLAY PANEL AND FABRICATION METHOD, AND DISPLAY DEVICE THEREOF

(71) Applicant: Shanghai Tianma Micro-Electronics Co., Ltd., Shanghai (CN)

(72) Inventors: Xingda Xia, Shanghai (CN); Gang Liu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/166,467

(22) Filed: Oct. 22, 2018

(65) Prior Publication Data
US 2020/0035748 A1 Jan. 30, 2020

(30) Foreign Application Priority Data
Jul. 27, 2018 (CN) .......................... 2018 1 0846967

(51) Int. Cl.
*H01L 27/15* (2006.01)
*G02B 5/20* (2006.01)
(Continued)

(52) U.S. Cl.
CPC ............ *H01L 27/156* (2013.01); *G02B 5/201* (2013.01); *H01L 25/167* (2013.01);
(Continued)

(58) Field of Classification Search
CPC ..... G02B 5/201; H01L 25/167; H01L 27/156; H01L 33/0075; H01L 33/20; H01L 33/32;
(Continued)

(56) References Cited

U.S. PATENT DOCUMENTS

| 2010/0171130 A1* | 7/2010 | Ashley ................ H01L 29/1606 257/88 |
| 2013/0044384 A1* | 2/2013 | Kim ......................... B05D 5/06 359/885 |

(Continued)

FOREIGN PATENT DOCUMENTS

| CN | 105914200 A | 8/2016 |
| CN | 107331680 A | 11/2017 |
| CN | 108281457 A | 7/2018 |

*Primary Examiner* — Allan R Wilson
(74) *Attorney, Agent, or Firm* — Anova Law Group PLLC

(57) ABSTRACT

A display panel is provided. The display panel includes a display region and a non-display region. The display region includes a first substrate, containing an N-type semiconductor layer including a plurality of protrusions and a plurality of light-emitting diodes. Each light-emitting diode includes an island-shaped structure. The island-shaped structure includes a protrusion, a light-emitting layer, and a P-type semiconductor layer. The display region also includes an N electrode and a plurality of P electrodes. The N electrode has a mesh structure, and the island-shaped structure is disposed in a mesh opening of the mesh structure. The N electrode is electrically connected to the N-type semiconductor layer. The plurality of P electrodes are disposed, in a one-to-one correspondence with the plurality of light-emitting diodes, on a side opposite to the N-type semiconductor layer. Each P electrode is electrically connected to the P-type semiconductor layer.

16 Claims, 8 Drawing Sheets

(51) Int. Cl.
*H01L 25/16* (2006.01)
*H01L 33/00* (2010.01)
*H01L 33/20* (2010.01)
*H01L 33/32* (2010.01)
*H01L 33/38* (2010.01)
*H01L 33/50* (2010.01)

(52) U.S. Cl.
CPC .......... *H01L 33/0075* (2013.01); *H01L 33/20* (2013.01); *H01L 33/32* (2013.01); *H01L 33/385* (2013.01); *H01L 33/50* (2013.01); *H01L 2933/0016* (2013.01)

(58) Field of Classification Search
CPC ....... H01L 33/38; H01L 33/385; H01L 33/50; H01L 2933/0016
See application file for complete search history.

(56) References Cited

U.S. PATENT DOCUMENTS

| | | | |
|---|---|---|---|
| 2014/0209955 A1* | 7/2014 | Kim | H01L 33/62 257/99 |
| 2015/0008465 A1* | 1/2015 | Saenger Nayver | H01L 33/405 257/98 |
| 2016/0240561 A1* | 8/2016 | Saito | H01L 27/1225 |
| 2017/0102797 A1* | 4/2017 | Cok | H01L 25/167 |
| 2019/0189835 A1* | 6/2019 | Dussaigne | H01L 33/32 |

\* cited by examiner

DISPLAY PANEL AND FABRICATION METHOD, AND DISPLAY DEVICE THEREOF

CROSS-REFERENCES TO RELATED APPLICATIONS

This application claims the priority of Chinese patent application No. 201810846967.X, filed on Jul. 27, 2018, the entirety of which is incorporated herein by reference.

FIELD OF THE DISCLOSURE

The present disclosure generally relates to the field of display technology and, more particularly, relates to a display panel and fabrication method, and a display device thereof.

BACKGROUND

Among human sensory organs, visual organ (eyes) receives the most information. In daily life, more and more rich visual information is desired, and, thus, display technology plays a very important role in today's human society. Since the emergence of the display technology, the display technology has been developed very rapidly. Cathode ray tube technology (CRT), plasma display (PDP), liquid crystal display (LCD), and even the latest organic light-emitting display (OLED), micro-diode (micro LED) display technologies have been successively developed.

The micro-diode (micro LED) display technology is featured with advantages such as low power consumption, and high brightness, etc., and has become one of development directions of the new generation display technology. How to further reduce the cost of the display device, increase the aperture ratio of the display device, and improve the display quality of the display device has become one of the key research directions.

The disclosed display panel and fabrication method, and display device are directed to solve one or more problems set forth above and other problems.

BRIEF SUMMARY OF THE DISCLOSURE

One aspect of the present disclosure provides a display panel. The display panel includes a display region and a non-display region. The display region includes a first substrate, containing an N-type semiconductor layer including a plurality of protrusions and a plurality of light-emitting diodes. Each light-emitting diode includes an island-shaped structure. The island-shaped structure includes a protrusion of the plurality of protrusions of the N-type semiconductor layer, a light-emitting layer over the protrusion, and a P-type semiconductor layer over the light-emitting layer. The display region also includes an N electrode and a plurality of P electrodes. The N electrode has a mesh structure, and the island-shaped structure is disposed in a mesh opening of the mesh structure. The N electrode and the island-shaped structure are disposed on a same side of the N-type semiconductor layer, and the N electrode is electrically connected to the N-type semiconductor layer. The plurality of P electrodes are disposed, in a one-to-one correspondence with the plurality of light-emitting diodes, on a side opposite to the N-type semiconductor layer. Each P electrode of the plurality of P electrodes is electrically connected to the P-type semiconductor layer.

Another aspect of the present disclosure provides a display device. The display device includes a display panel including a display region and a non-display region. The display region includes a first substrate, containing an N-type semiconductor layer including a plurality of protrusions and a plurality of light-emitting diodes. Each light-emitting diode includes an island-shaped structure. The island-shaped structure includes a protrusion of the plurality of protrusions of the N-type semiconductor layer, a light-emitting layer over the protrusion, and a P-type semiconductor layer over the light-emitting layer. The display region also includes an N electrode and a plurality of P electrodes. The N electrode has a mesh structure, and the island-shaped structure is disposed in a mesh opening of the mesh structure. The N electrode and the island-shaped structure are disposed on a same side of the N-type semiconductor layer, and the N electrode is electrically connected to the N-type semiconductor layer. The plurality of P electrodes are disposed, in a one-to-one correspondence with the plurality of light-emitting diodes, on a side opposite to the N-type semiconductor layer. Each P electrode of the plurality of P electrodes is electrically connected to the P-type semiconductor layer.

Another aspect of the present disclosure provides a method for forming a display panel. The method includes providing a first base substrate and forming a first N-type semiconductor layer by growth on the first base substrate. The method also includes forming a first light-emitting layer by growth on a side of the first N-type semiconductor layer opposite to the first base substrate and forming a first P-type semiconductor layer by growth on a side of the first light-emitting layer opposite to the first base substrate. In addition, the method includes patterning the first N-type semiconductor layer, the first light-emitting layer, and the first P-type semiconductor layer to form a plurality of protrusions from the first N-type semiconductor layer, form a plurality of light-emitting layers from the first light-emitting layer, and form a plurality of P-type semiconductor layers from the first P-type semiconductor layer. Further, the method includes forming an electrode layer and patterning the electrode layer to form an N electrode and a plurality of P electrodes. The N electrode has a mesh structure and is disposed on a side of the first N-type semiconductor layer opposite to the first base substrate. Each P electrode of the plurality of P electrodes is disposed on a side of the P-type semiconductor layer of the plurality of P-type semiconductor layers opposite to the first base substrate.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
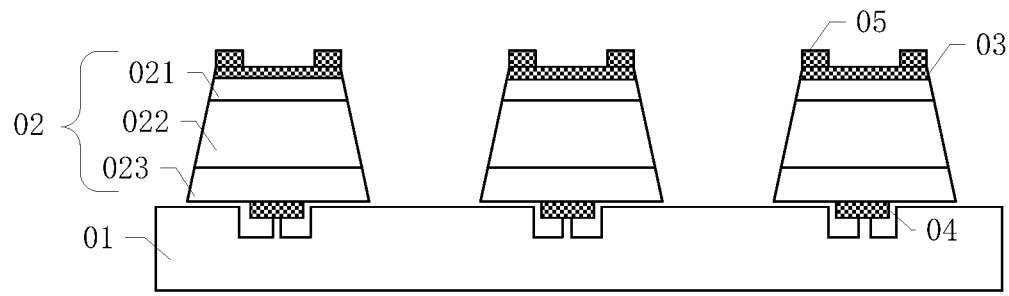
FIG. 1 illustrates a schematic local cross-sectional view of an existing display panel.

The existing display panel has high production cost and low production efficiency. FIG. 1 illustrates a schematic local cross-sectional view of an existing display panel. Referring to FIG. 1, the display panel includes a substrate 01, and a plurality of light-emitting diodes 02. A light-emitting diode includes an N-type doped layer 021, a light-emitting layer 022, and a P-type doped layer 023. The light-emitting layer 022 is disposed between the N-type doped layer 021 and the P-type doped layer 023.

A fabrication method for forming the existing display panel includes a transfer process. In other words, each one light-emitting diode 02 has to be removed from an original growth substrate, and transferred and assembled into the display panel. The transfer process is complicated and substantially difficult, which not only increases the production cost of the display panel, but also reduces the production efficiency of the display panel.

In addition, the light-emitting diode 02 further includes a top conductive electrode 03 and a bottom conductive electrode 04. The top conductive electrode 03 is electrically connected to an auxiliary metal electrode 05. The auxiliary metal electrode 05 is disposed surrounding the top conductive electrode 03 of the light-emitting diode 02 to form a surrounding shape. Because the auxiliary metal electrode 05 is opaque, a light-emitting area of the light-emitting diode 02 decreases, and, thus, the display quality of the existing display panel is poor.

Figure 2:
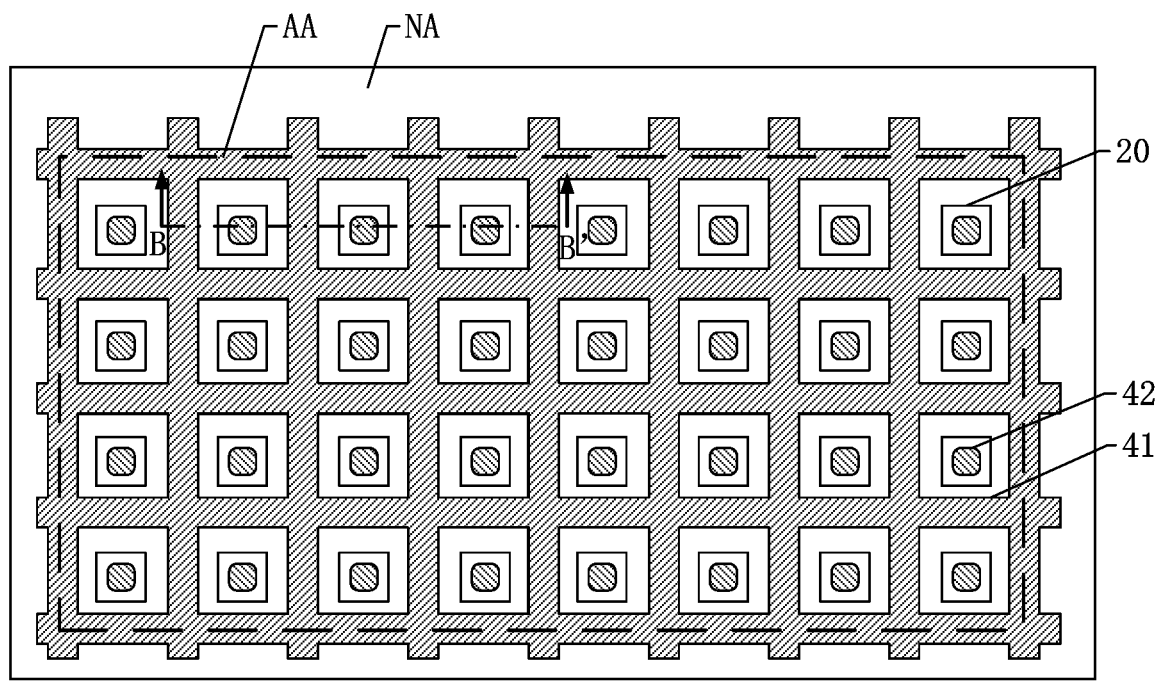
FIG. 2 illustrates a schematic diagram of an exemplary display panel consistent with disclosed embodiments of the present disclosure.
Figure 3:
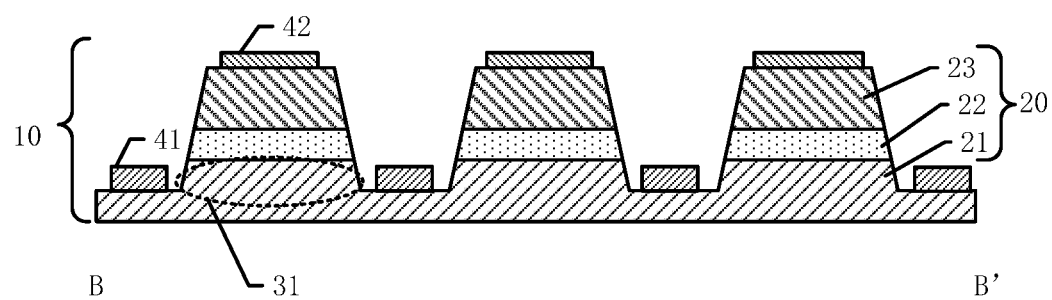
FIG. 3 illustrates a schematic BB'-sectional view of an exemplary display panel in FIG. 2 consistent with disclosed embodiments of the present disclosure.

The present disclosure provides a display panel. FIG. 2 illustrates a schematic diagram of a display panel consistent with disclosed embodiments of the present disclosure; and FIG. 3 illustrates a schematic BB'-sectional view of the display panel in FIG. 2. Referring to FIGS. 2 and 3, the display panel may include a display region AA and a non-display region NA. The display region AA may include a first substrate 10 containing an N-type semiconductor layer 21 including a plurality of protrusions 31 and a plurality of light-emitting diodes 20. Each light-emitting diode 20 may include an island-shaped structure, and the island-shaped structure may include a protrusion 31 of the N-type semiconductor layer, a light-emitting layer 22 over the protrusion 31, and a P-type semiconductor layer 23 over the light-emitting layer 22.

The display panel may also include an N electrode 41 and a plurality of P electrodes 42. The N electrode 41 may have a mesh structure, and the island-shaped structure may be disposed in a mesh opening of the mesh structure. The N electrode 41 may be disposed on a side of the N-type semiconductor layer 21 facing toward the island-shaped structure, and may be electrically connected to the N-type semiconductor layer 21.

The plurality of P electrodes 42 may be disposed in a one-to-one correspondence with the plurality of light-emitting diodes 20. The P electrode 42 may be disposed on a side of the P-type semiconductor layer 23 of a corresponding light-emitting diode 20 opposite to the N-type semiconductor layer 21. The P electrode 42 may be electrically connected to the P-type semiconductor layer 23.

In one embodiment, the display panel may include the display region AA and the non-display region NA. The display region AA may be used to display image information, and may include the plurality of light-emitting diodes. The light-emitting diode may emit light of different brightness to display the image information. The non-display region NA may be disposed with circuits or electronic components.

For example, a light-emitting diode (LED) is a type of semiconductor diode that converts electrical energy into light energy. The light-emitting diode may include a PN junction and may have unidirectional conductivity. When appropriate voltages are respectively applied to the N electrode 41 and the P electrode 42 of the light-emitting diode, holes generated from the P-type semiconductor layer 23 and electrons generated from the N-type semiconductor layer 21 may be combined, and, thus, the light-emitting diode may generate spontaneous emission of fluorescence.

The display panel in the disclosed embodiments may include the first substrate. The plurality of light-emitting diodes 20 may be disposed in the first substrate, and may include the island-shaped structures. The N-type semiconductor layer 21 of the plurality of light-emitting diodes 20 may be integrally disposed, and may cover the display region AA. The N-type semiconductor layer 21 may include the plurality of protrusions 31. The light-emitting layer 22 and the P-type semiconductor layer 23 each of the light-emitting diode 20 may be formed over the protrusion 31. In the island-shaped structure, the protrusion 31, the light-emitting layer 22, and the P-type semiconductor layer 23 may be successively laminated.

The display panel may also include the N electrode 41 and the plurality of P electrodes 42. The N electrode 41 of the plurality of light-emitting diodes 20 may have a mesh structure, and the island-shaped structure of the light-emitting diode 20 may be disposed in the mesh opening of the mesh structure. The plurality of P electrodes 42 may be independent of each other, and the plurality of light-emitting diodes 20 may be electrically connected in a one-to-one correspondence with the plurality of P electrodes 42.

In one embodiment, the N electrode 41 may be made of a metal, and the P electrode 42 may be made of a metal. The metal material has desired electrical conductivity, and the manufacturing process thereof may be substantially simple.

When the display panel in the disclosed embodiments is in operation, because the N electrode 41 of the plurality of light-emitting diodes 20 is integrally disposed, a same voltage signal may be applied to the N electrodes of the plurality of light-emitting diodes 20. By providing different voltage signals to the P electrodes 42 of different light-emitting diodes 20, whether the different light-emitting diodes 20 emit light and the brightness of the illumination may be controlled.

In the display panel in the disclosed embodiments, the plurality of light-emitting diodes 20 may have the island-shaped structures, and the N-type semiconductor layer 21 of the plurality of light-emitting diodes 20 may be integrally disposed. After being fabricated, the first substrate may be integrally assembled into the display panel. Compared with the prior art, the transfer process, in which each one light-emitting diode 20 is removed from the original growth substrate, and transported and assembled into the display panel, may not be desired. Therefore, the production cost of the display panel may be reduced, and the production efficiency of the display panel may be improved. Moreover, in the display panel in the disclosed embodiments, the opaque auxiliary metal electrode may not be desired in the light-emitting diode 20. Therefore, the light-emitting area of the light-emitting diode 20 may increase, thereby improving the display quality of the display panel. In addition, in the fabrication process of the display panel, the N electrode 41 and the plurality of P electrodes 42 may be formed at the same time by patterning a same one conductive layer. Therefore, the electrode structure of the display panel may be simple, and the fabrication method may be simple and efficient.

Figure 4:
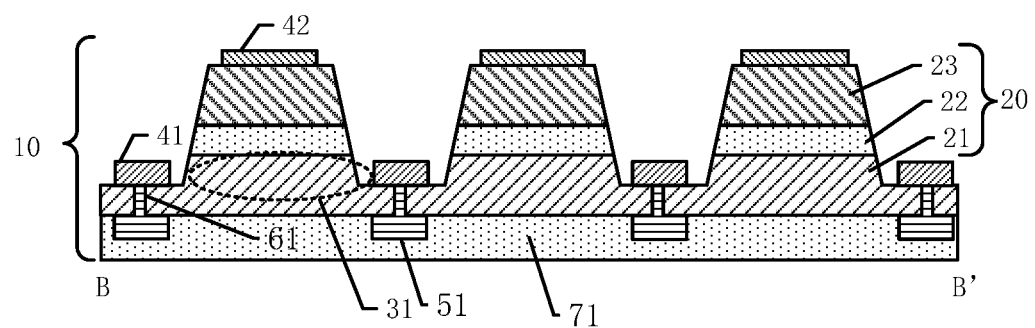
FIG. 4 illustrates another schematic BB'-sectional view of an exemplary display panel in FIG. 2 consistent with disclosed embodiments of the present disclosure.

FIG. 4 illustrates another schematic BB'-sectional view of the display panel in FIG. 2. In another embodiment, referring to FIGS. 2 and 4, the first substrate 10 may further include a first auxiliary N electrode 51. The first auxiliary N electrode 51 may be disposed on a side of the N-type semiconductor layer 21 facing away from the island-shaped structure. The N-type semiconductor layer 21 may include first through-holes 61. The first auxiliary N electrode 51 may be electrically connected to the N electrode 41 through the first through-holes 61. In one embodiment, an orthogonal projection of the N electrode 41 onto the N-type semiconductor layer 21 may have a same shape as an orthogonal projection of the first auxiliary N electrode 51 onto the N-type semiconductor layer 21.

Because the N electrode 41 has a mesh structure, the resistance thereof may be substantially large, and thus, the loss of the voltage signal in the N electrode 41 may be substantially large. Therefore, the voltage signals at different locations of the N electrode 41 may be different, causing different light-emitting performance of the light-emitting diodes 20 at different locations and an uneven display phenomenon.

In one embodiment, the first auxiliary N electrode may be disposed to be electrically connected to the N electrode 41. The first auxiliary N electrode may be disposed on the side of the N-type semiconductor layer 21 facing away from the island-shaped structure. Therefore, the current applied by the N electrodes (the first auxiliary N electrode and the N electrode 41) to the light-emitting diodes may be substantially uniform, which may improve the uniformity of the light-emitting performance of the plurality of light-emitting diodes 20. Further, the N electrode 41 and the first auxiliary N electrode may be connected in parallel, and an equivalent resistance of the N electrode 41 and the first auxiliary N electrode in parallel may be smaller than the resistance of the N electrode 41. Thus, the loss of voltage signal in the N electrode 41 may be reduced, which may improve the uniformity of the voltage signals at different locations of the N electrode 41. Therefore, the uniformity of the light-emitting performance of the plurality of light-emitting diodes 20 may be improved, thereby improving the uneven display phenomenon, and further improving the display quality.

In certain embodiments, referring to FIGS. 2 and 4, the first substrate 10 may further include a planar second auxiliary N electrode 71. The second auxiliary N electrode 71 may cover a surface of the first auxiliary N electrode 51 facing away from the N-type semiconductor layer 21. In one embodiment, the second auxiliary N electrode 71 may have a planar shape. For example, the second auxiliary N electrode 71 may be disposed as a whole surface and may cover the display region AA. The second auxiliary N electrode 71 may be in direct contact with and electrically connected to the first auxiliary N electrode 51.

In one embodiment, the second auxiliary N electrode 71 may be made of a transparent conductive material, e.g., indium tin oxide (ITO), indium gallium zinc oxide (IGZO), indium zinc oxide (IZO), etc. Indium tin oxide, indium gallium zinc oxide, and indium zinc oxide each has desired conductivity and substantially high electron mobility, and is transparent in a form of a film. The use of a transparent conductive material for fabricating the second auxiliary N electrode 71 may reduce absorption or blocking of the light emitted from the light-emitting diodes 20, and ensure the display quality of the display panel.

The second auxiliary N electrode 71 and the first auxiliary N electrode 51 may be connected in parallel, and an equivalent resistance of the second auxiliary N electrode 71 and the first auxiliary N electrode 51 in parallel may be smaller than the resistance of the first auxiliary N electrode 51. Thus, the loss of the voltage signal in the first auxiliary N electrode 51 may be reduced, which may improve the uniformity of the voltage signals at different locations of the first auxiliary N electrode 51. Therefore, the uniformity of the light-emitting performance of the plurality of light-emitting diodes 20 may be improved, thereby improving the uneven display phenomenon, and further improving the display quality.

Figure 5:
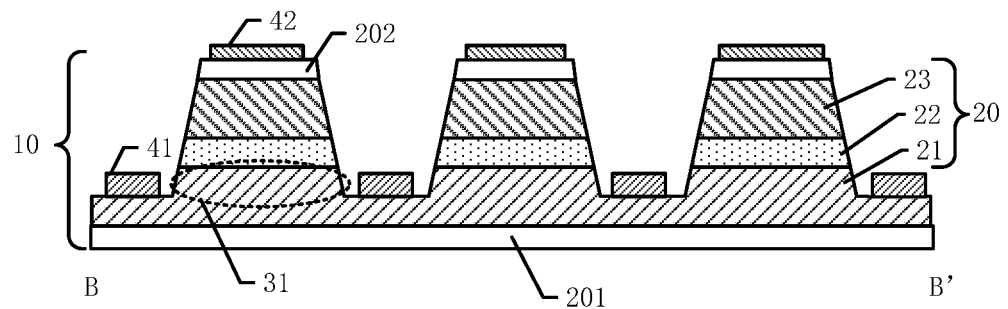
FIG. 5 illustrates another schematic BB'-sectional view of an exemplary display panel in FIG. 2 consistent with disclosed embodiments of the present disclosure.

FIG. 5 illustrates another schematic BB'-sectional view of the display panel in FIG. 2. In another embodiment, referring to FIG. 5, the plurality of light-emitting diodes 20 may further include a first current spreading layer 201 and a plurality of second current spreading layers 202. The first current spreading layer 201 of the plurality of light-emitting diodes 20 may be integrally disposed, and have a planar shape. The plurality of second current spreading layers 202 of the plurality of light-emitting diodes 20 may be independent of each other, and the island-shaped structure may also include a second current spreading layer 202.

The first current spreading layer 201 may be disposed on a side of the N-type semiconductor layer 21 facing away from the P-type semiconductor layer 23. The second current spreading layer 202 may be disposed on a side of the P-type semiconductor layer 23 facing away from the N-type semiconductor layer 21.

The light-emitting diodes 20 in the disclosed embodiments may include the current spreading layers (the first current spreading layer and the second current spreading layers) with desired current spreading capability, which may facilitate to increase the brightness of the light-emitting diodes 20, thereby further improving the display quality of the display panel.

Figure 6:
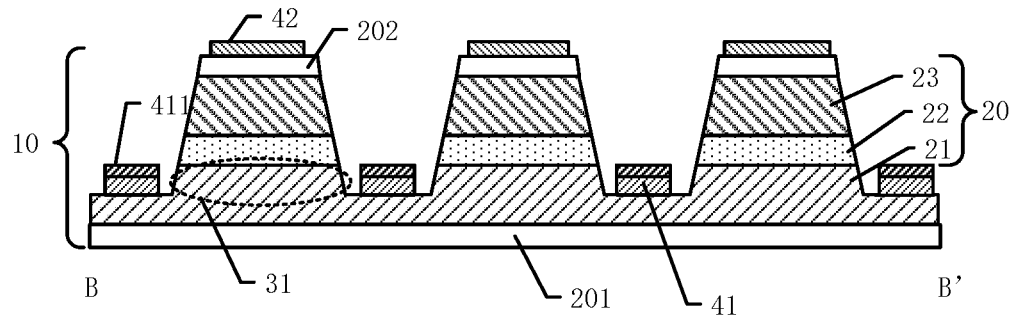
FIG. 6 illustrates another schematic BB'-sectional view of an exemplary display panel in FIG. 2 consistent with disclosed embodiments of the present disclosure.

In certain embodiments, referring to FIG. 6, the N electrode may include an oxide layer 411. The oxide layer 411 may be disposed on a side surface of the N electrode 41 facing away from the N-type semiconductor layer 21. In the fabrication process of the display panel in the disclosed embodiments, after the N electrode 41 is fabricated, the oxide layer 411 may be formed by oxidizing the surface of the N electrode 41. For example, when the N electrode 41 is made of an aluminum-containing material, the oxide layer 411 may be made of an aluminum oxide-containing material. Because the N electrode 41 is often made of a metal material, the surface thereof may be substantially smooth, and may have a substantially high light reflectance. The oxide layer 411 formed by oxidizing the N electrode may often have substantially rough surface, and may have a substantially low light reflectance. The oxide layer 411 formed on the surface of the N electrode may reduce the light reflected by the N electrode and reduce the reflected light inside the display panel, thereby improving the display quality.

Figure 7:
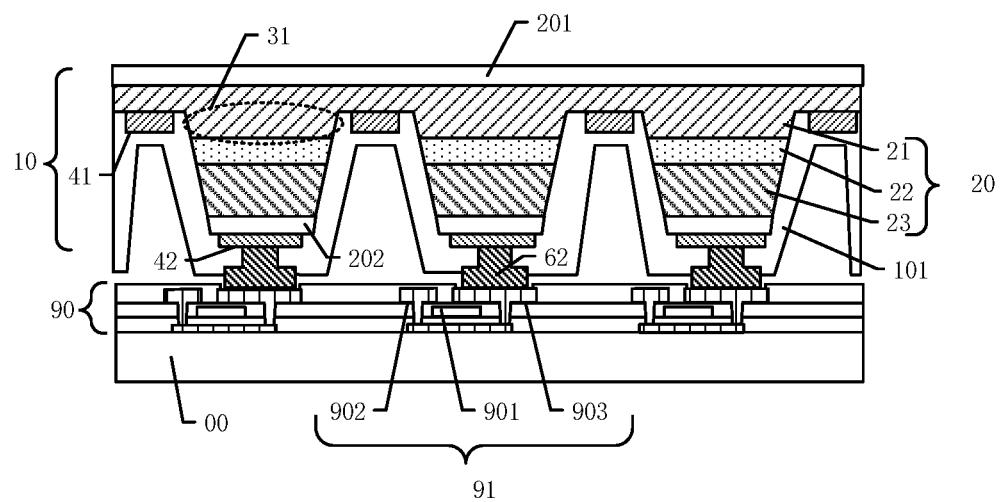
FIG. 7 illustrates a schematic local cross-sectional view of another exemplary display panel consistent with disclosed embodiments of the present disclosure.

In one embodiment, in the display panel in the disclosed embodiments, a driving manner of the light-emitting diode may be one of a passive matrix and an active matrix. FIG. 7 illustrates a schematic local cross-sectional view of another display panel consistent with disclosed embodiments of the present disclosure. Referring to FIG. 7, the active matrix is used as an example for illustrative purposes. The display panel may further include a driving array layer 90. The driving array layer 90 may include a plurality of thin film transistors 91. A thin film transistor 91 may include a gate 901, a source 902, and a drain 903. The plurality of thin film transistors 91 may be electrically connected in a one-to-one correspondence with the plurality of light-emitting diodes 20. The drain 903 of the thin film transistor 91 may be electrically connected to the P electrode 42 of the corresponding light-emitting diode 20. In one embodiment, the driving array layer 90 may be disposed on a first base 00.

In the display panel illustrated in FIG. 7, the first substrate illustrated in FIG. 5 is used as an example for illustrative purposes. In certain embodiments, the display panel may include any one of the first substrates illustrated in FIGS. 3, 4, and 6, and details are not repeated herein.

In the display panel in the disclosed embodiments, each one light-emitting diode 20 may be provided with a corresponding independent driving circuit, and the independent driving circuit may include the thin film transistor 91. The detailed circuit structure of the independent driving circuit is not limited by the present disclosure, and may be determined according to practical applications.

In the fabrication process of the display panel in the disclosed embodiments, the first substrate and the driving array layer may be respectively fabricated. Then, the first substrate and the driving array layer may be aligned and assembled. Because the first substrate and the driving array layer are respectively fabricated, the production efficiency of the display panel may be improved.

Moreover, because the first substrate and the array layer are aligned and assembled integrally, the transfer process, in which each one light-emitting diode 20 is removed from the original growth substrate, and transported and assembled into the array layer, may not be desired. Therefore, the fabrication difficulty of the display panel may be reduced, the production cost of the display panel may be reduced, and the production efficiency of the display panel may be improved.

In one embodiment, referring to FIG. 7, the display panel may further include a plurality of connection parts 62. The drain 903 of the thin film transistor 91 may be electrically connected to the P electrode 42 of the corresponding light-emitting diode 20 through the connection part 62.

Because the drain 903 of the thin film transistor 91 and the P electrode 42 are often made of a metal material with desired conductivity, use of the direct contact for electrical connection between the drain 903 of the thin film transistor 91 and the P electrode 42 may desire substantially high process precision, and may have low electrical connection reliability. In the display panel in the disclosed embodiments, the connection part 62 may be provided. The connection part 62 may be used to connect the drain 903 of the thin film transistor 91 and the P electrode 42. The drain 903 of the thin film transistor 91 and the P electrode 42 each may be in desired contact with the connection part 62, and, thus, the reliability of the electrical connection between the drain 903 of the thin film transistor 91 and the P electrode 42 may be improved.

In one embodiment, referring to FIG. 7, the connection part 62 may be made of an anisotropic conductive paste. The anisotropic conductive paste may be conductive in a direction perpendicular to the display panel and may be non-conductive in a direction parallel to the display panel. Further, the anisotropic conductive paste may be in desired contact with the drain 903 of the thin film transistor 91 and the P electrode 42, and, thus, the electrical connection performance may be desired, and the electrical connection reliability may be substantially high.

In certain embodiments, referring to FIG. 7, the first substrate 10 may further include a protection layer 101. The protection layer 101 may cover the plurality of island-shaped structures and expose the plurality of P electrodes 42. In one embodiment, the protection layer 101 may be made of an organic material or an inorganic material. The protection layer 101 may be made of an insulating material. The protection layer 101 may cover the plurality of island-shaped structures to protect the light-emitting diodes 20 from being eroded by air, to improve the reliability of the display panel, and to improve the quality of the reality.

In the fabrication process of the protection layer 101, the protection layer 101 may have to be patterned to expose the P electrode 42, and, thus, the P electrode 42 may be electrically connected to the drain 903 of the thin film transistor 91.

Figure 8:
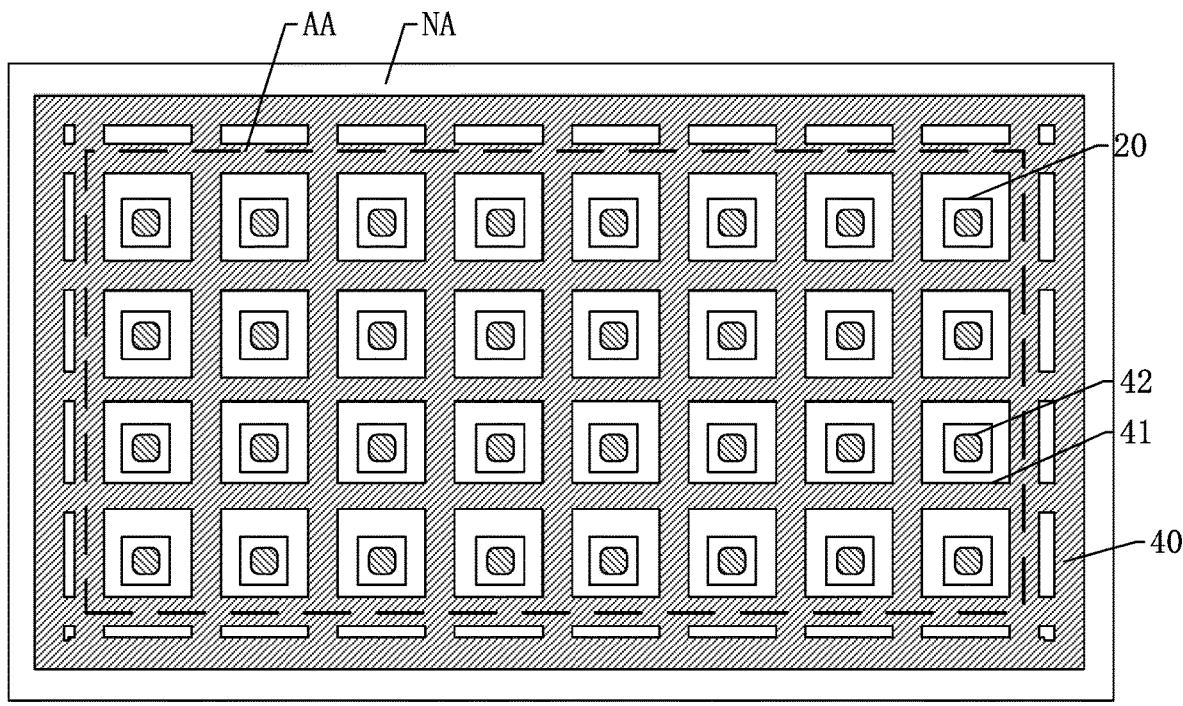
FIG. 8 illustrates a schematic diagram of another exemplary display panel consistent with disclosed embodiments of the present disclosure.

FIG. 8 illustrates a schematic diagram of another display panel consistent with disclosed embodiments of the present disclosure. In certain embodiments, referring to FIG. 8. the first substrate 10 may further include an N-electrode signal bus 40 disposed in the non-display region NA. The N-electrode signal bus 40 may be disposed surrounding the display region AA and may be electrically connected to the N-electrode 41. Because the N-electrode 41 has a mesh structure, the electrical resistance thereof may be substantially large. In the display panel in the disclosed embodiments, the ring-shaped N-electrode signal bus 40 may be disposed in the non-display region NA, and may be electrically connected to the N-electrode 41 at a plurality of locations to transmit electrical signals to the N electrode 41 from the plurality of locations around to the N electrode 41, which may facilitate to improve the uniformity of the electrical signal in the N electrode. Thus, the disposure of the N-electrode signal bus 40 may prevent serious loss of the voltage signal in the N electrode 41 and difference between voltage signals at different locations of the N electrode 41. Therefore, the light-emitting performance difference of the light-emitting diodes 20 at different locations and uneven display phenomenon may be avoided.

In one embodiment, the N electrode 41 and the N electrode signal bus 40 may be made of a same material and may be disposed in a same layer. Further, the N electrode 41 and the N electrode signal bus 40 may be an integrally formed structure. In other words, in the fabrication process of the display panel, the N electrode 41 and the N electrode signal bus 40 may be formed at the same time by patterning a same conductive layer, which may facilitate to reduce process steps for forming the display panel, improve the production efficiency of the display panel, and reduce the production cost of the display panel.

Figure 9:
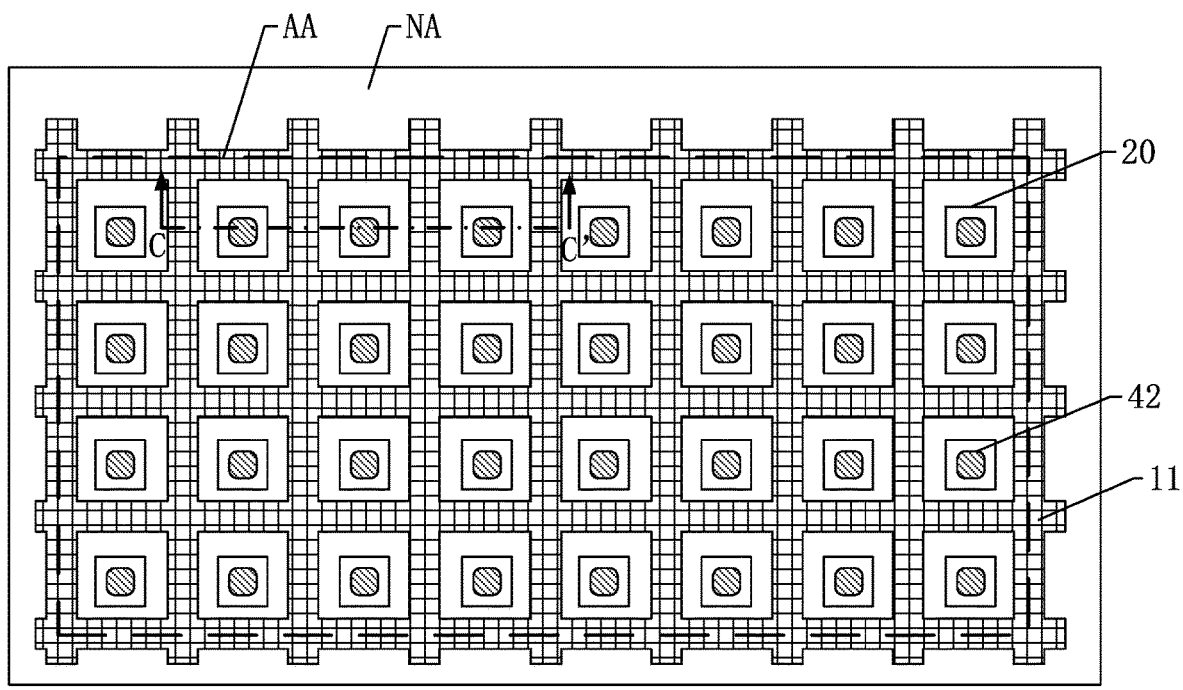
FIG. 9 illustrates a schematic diagram of another exemplary display panel consistent with disclosed embodiments of the present disclosure.
Figure 10:
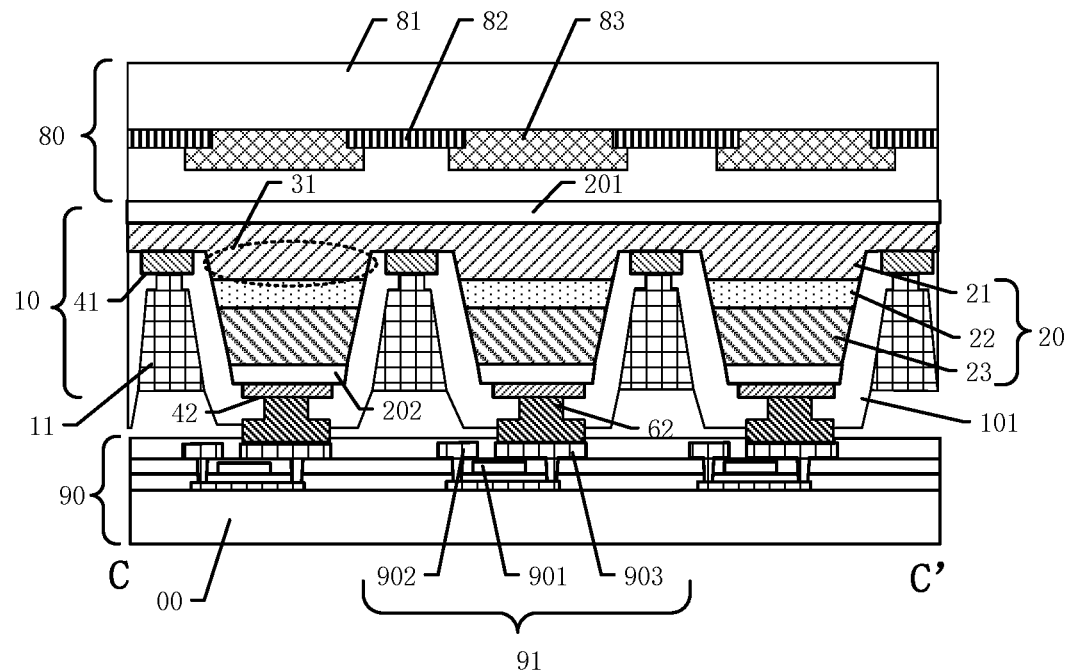
FIG. 10 illustrates a schematic CC'-sectional view of an exemplary display panel in FIG. 9 consistent with disclosed embodiments of the present disclosure.

FIG. 9 illustrates a schematic diagram of another display panel consistent with disclosed embodiments of the present disclosure; and FIG. 10 illustrates a schematic CC'-sectional view of the display panel in FIG. 9. In certain embodiments, referring to FIGS. 9 and 10, the display panel may further include a color film substrate 80 disposed opposite to the first substrate 10. In one embodiment, the color film substrate 80 may be disposed on a side of the first substrate 10 facing away from the driving array layer 90. The color film substrate 80 may filter light to enable the display panel to display colored light.

In one embodiment, the color film substrate 80 may include a second base 81, a black matrix 82 disposed on the second base 81, and a wavelength conversion layer 83. In one embodiment, the wavelength conversion layer 83 may be a color resistor, and the color resistor may have a plurality of colors, e.g., red, green, and blue, which are not limited by the present disclosure. The light-emitting diode 20 may emit light of a same color, e.g., a white light-emitting diode. After being filtered by the color film substrate 80, the light emitted from the light-emitting diode 20 may display variety of colors.

In another embodiment, the wavelength conversion layer 83 may be fluorescent powder or a quantum dot film. The light-emitting diode 20 may emit light of a same color, e.g., a blue light-emitting diode. The light emitted from the blue light-emitting diode may have a substantially short wavelength and a substantially large energy, and after irradiating on the wavelength conversion layer 83, may excite the fluorescent powder or the quantum dot film to produce colored light of other colors, e.g., red, green, or white light.

Because the light-emitting diodes 20 in the first substrate 10 may emit light of a same color, the fabrication process may be substantially simple. The disposure of the color film substrate 80 in the display panel may implement the color display and reduce the fabrication difficulty of the display panel, thereby improving the production efficiency of the display panel and reducing the production cost of the display panel.

In certain embodiments, referring to FIGS. 9 and 10, the first substrate 10 may further include a light-shading portion 11. The light-shading portion 11 may include a plurality of openings, and the island-shaped structure may be located in the opening of the light-shading portion 11.

In one embodiment, the light-shading portion 11 may be disposed on a side of the N electrode facing away from the N-type semiconductor layer 21. The light-shading portion 11 may block the light, and may be made of a black light-shading material. The light-shading portion 11 may have an approximate grid-like shape, and the opening of the light-shading portion 11 may be a mesh opening of the mesh structure.

In the display panel provided with the color film substrate 80, the light-shading portion 11 may prevent the light emitted from the two adjacent light-emitting diodes 20 from being mixed, thereby improving the display quality of the display panel.

To clearly explain the technical solution of the disclosed embodiments, FIG. 9 omits a part of the film layer structures of the display panel and shows the structure of the light-shading portion 11.

In one embodiment, in any one of display panels in the disclosed embodiments, referring to FIGS. 2 and 3, an area of the orthogonal projection of the island-shaped structure onto the first substrate is S, and 25 $\mu m^2 \leq S \leq 10000$ $\mu m^2$. In one embodiment, the area of the island-shaped structure of the light-emitting diode 20 cannot be too small. When the area of the island-shaped structure of the light-emitting diode 20 is less than 25 $\mu m^2$, the fabrication process precision may desire to be substantially high, and the fabrication process difficulty of the display panel may greatly increase. The area of the island-shaped structure of the light-emitting diode 20 cannot be too large. When the area of the island-shaped structure of the light-emitting diode 20 is larger than 10000 $\mu m^2$, pixels per inch (PPI) of the display panel may be substantially low, and the display quality may be lowered.

In one embodiment, in any one of display panels in the disclosed embodiments, referring to FIGS. 2 and 3, the N-type semiconductor layer 21 may be made of n-GaN, and the P-type semiconductor layer 23 may be made of p-GaN. In one embodiment, the light-emitting layer 22 may include $In_yGa_{(1-y)}N$ layers and GaN layers, where y=0.015-0.25. n-GaN and p-GaN are desired semiconductor materials, and the light-emitting diode 20 made of n-GaN and p-GaN may have substantially high light-emission efficiency. In one embodiment, the light-emitting layer 22 may include at least one layer of $In_yGa_{(1-y)}N$ layers and at least one layer of GaN layers. In another embodiment, the light-emitting layer 22 may include a plurality of layers of $In_yGa_{(1-y)}N$ layers and a plurality of layers of GaN layers, where the $In_yGa_{(1-y)}N$ layers and the GaN layers may be alternately arranged. The value of y may affect the color of the light emitted from the light-emitting diode 20.

Figure 11:
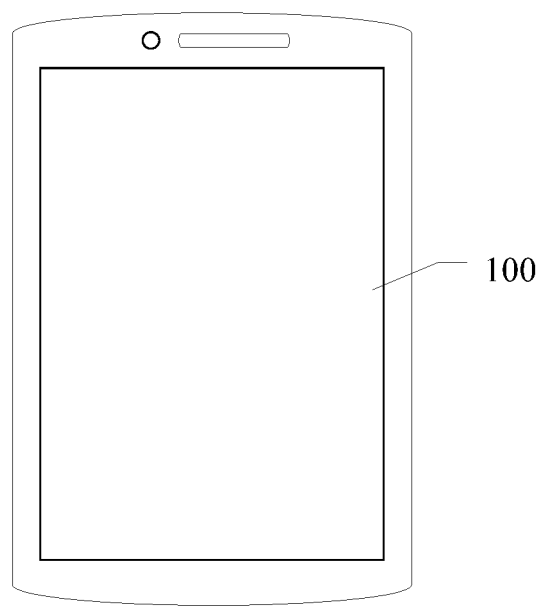
FIG. 11 illustrates a schematic top view of an exemplary display device consistent with disclosed embodiments of the present disclosure.

The present disclosure further provides a display device. FIG. 11 illustrates a schematic top view of a display device consistent with disclosed embodiments of the present disclosure. Referring to FIG. 11, a display device 1000 in the disclosed embodiments may include a display panel 100 in the disclosed embodiments. For illustrative purposes, the display device 1000 illustrated in FIG. 11 is described using a mobile phone as an example. The display device in the disclosed embodiments may be any appropriate display device having a display function, e.g., a computer, a television, or an in-vehicle display device, etc., which is not limited by the present disclosure, and may be determined according to practical applications. The display device in the disclosed embodiments may be featured with same advantages as the display panel in the disclosed embodiments. Details of the display device may refer to the detailed descriptions of the display panel in the disclosed embodiments, and are not repeated herein.

Figure 12:
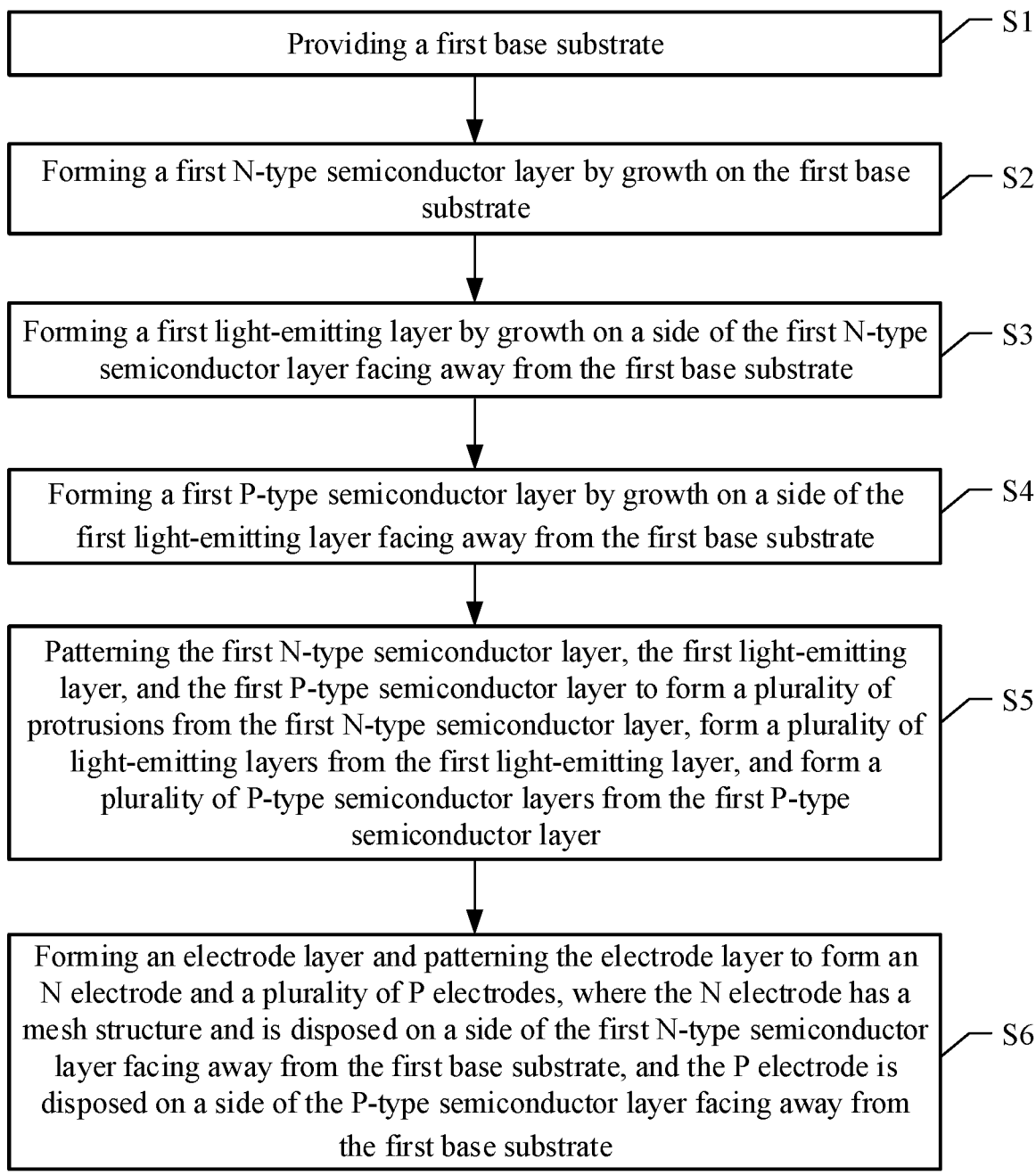
FIG. 12 illustrates an exemplary fabrication method for forming a display panel consistent with disclosed embodiments of the present disclosure.

The present disclosure further provides a method for forming a display panel. FIG. 12 illustrates a fabrication method for forming the display panel consistent with disclosed embodiments of the present disclosure; and FIGS. 13-18 illustrate semiconductor structures corresponding to certain stages of the fabrication method in FIG. 12. In one embodiment, referring to FIG. 12, the fabrication method for forming the display panel may include the following.

Figure 13:
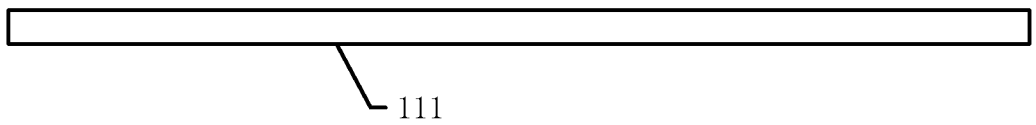
FIGS. 13-18 illustrate semiconductor structures corresponding to certain stages of an exemplary fabrication method in FIG. 12 consistent with disclosed embodiments of the present disclosure.
Figure 14:
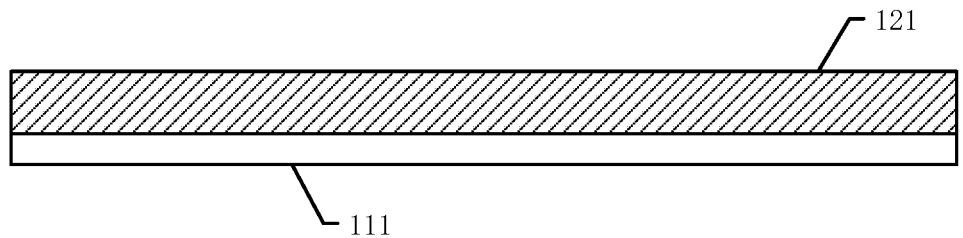
Figure 15:
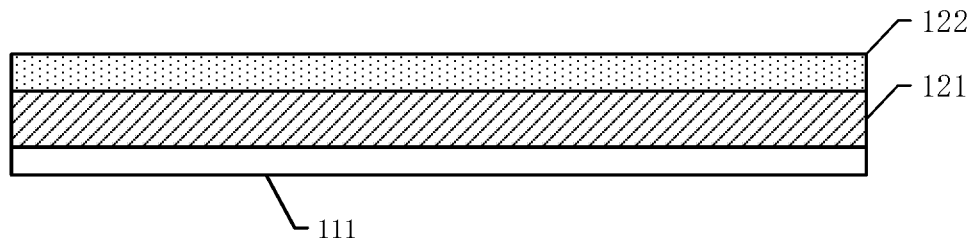
Figure 16:
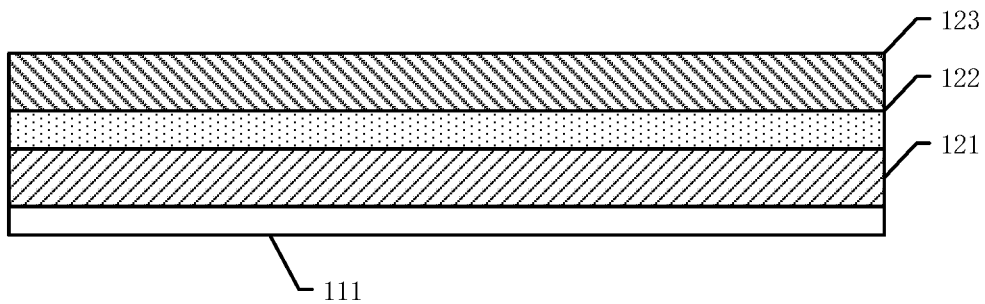
Figure 17:
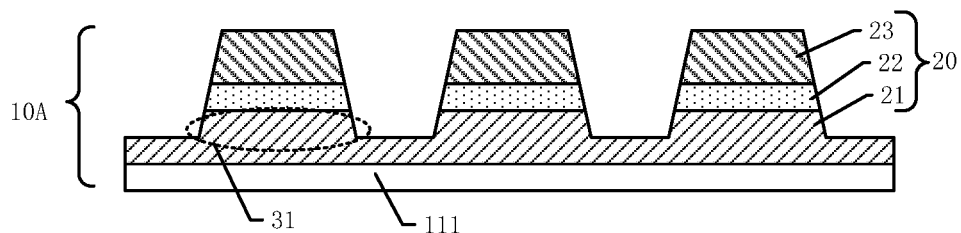
Figure 18:
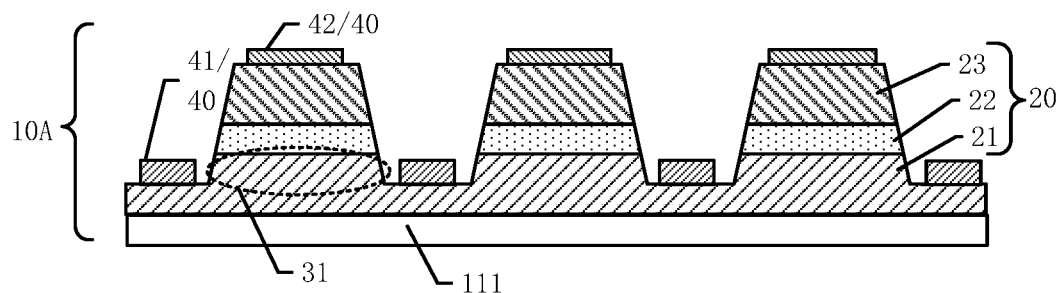

- S1: Providing a first base substrate 111, as illustrated in FIG. 13.
- S2: Forming a first N-type semiconductor layer 121 by growth on the first base substrate 111, as illustrated in FIG. 14.
- S3: Forming a first light-emitting layer 122 by growth on a side of the first N-type semiconductor layer 121 facing away from the first base substrate 111, as illustrated in FIG. 15.
- S4: Forming a first P-type semiconductor layer 123 by growth on a side of the first light-emitting layer 122 facing away from the first base substrate 111, as illustrated in FIG. 16.
- S5: Patterning the first N-type semiconductor layer 121, the first light-emitting layer 122, and the first P-type semiconductor layer 123 to form a plurality of protrusions 31 from the first N-type semiconductor layer 121, form a plurality of light-emitting layers 22 from the first light-emitting layer 122, and form a plurality of P-type semiconductor layers 23 from the first P-type semiconductor layer 123, as illustrated in FIG. 17.
- S6: Forming an electrode layer 40, and patterning the electrode layer 40 to form an N electrode 41 and a plurality of P electrodes 42, as illustrated in FIG. 18. The N electrode 41 may have a mesh structure and may be disposed on a side of the first N-type semiconductor layer facing away from the first base substrate 111. The P electrode 42 may be disposed on a side of the P-type semiconductor layer 23 facing away from the first base substrate 111.

In the display panel fabricated by the fabrication method in the disclosed embodiments, the first N-type semiconductor layer 121, the first light-emitting layer 122, and the first P-type semiconductor layer 123 may be patterned to obtain a plurality of light-emitting diodes 20. The plurality of light-emitting diodes 20 may have island-shaped structures. An N-type semiconductor layer 21 of the plurality of light-emitting diodes 20 may be disposed integrally. Therefore, after being fabricated, a second substrate 10A may be integrally assembled into the display panel. The transfer process, in which each one light-emitting diode 20 is removed from the original growth substrate, and transported and assembled into the display panel, may not be desired. Thus, the production cost of the display panel may be reduced, and the production efficiency of the display panel may be improved. Moreover, in the display panel fabricated by the fabrication method in the disclosed embodiments, the opaque auxiliary metal electrode may not be desired in the light-emitting diode 20. Therefore, the light-emitting area of the light-emitting diode 20 may increase, thereby improving the display quality of the display panel.

Figure 19:
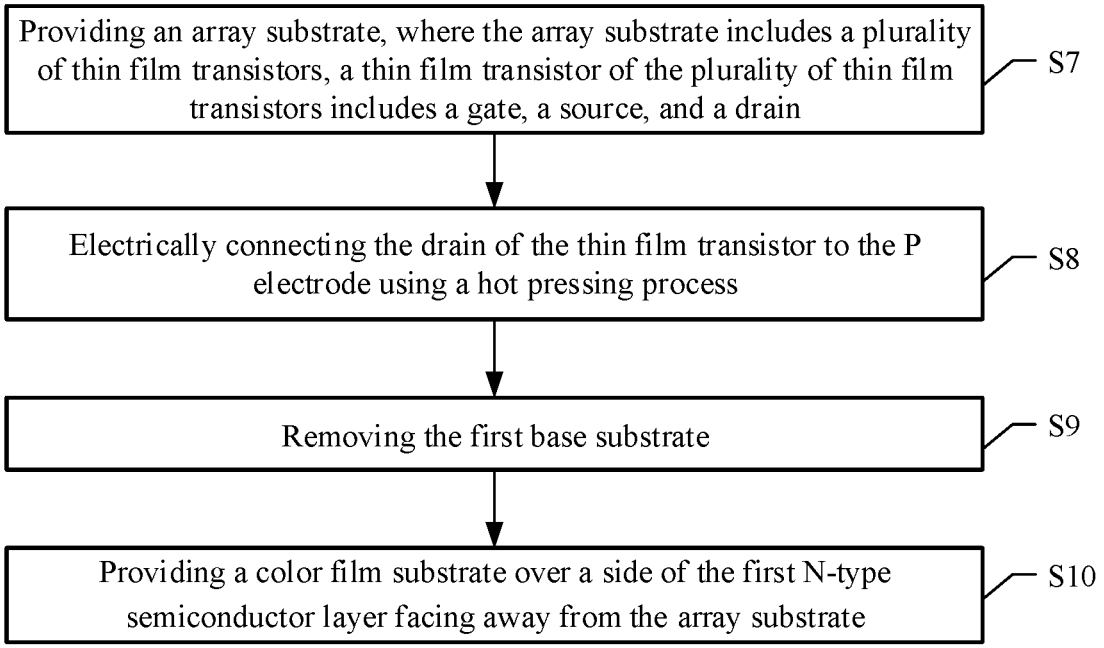
FIG. 19 illustrates another exemplary fabrication method for forming a display panel consistent with disclosed embodiments of the present disclosure.

FIG. 19 illustrates another fabrication method for forming a display panel consistent with disclosed embodiments of the present disclosure; and FIGS. 20-23 illustrate semiconductor structures corresponding to certain stages of the fabrication method in FIG. 19. In one embodiment, referring to FIG. 19, the fabrication method for forming the display panel may include the following.

Figure 20:
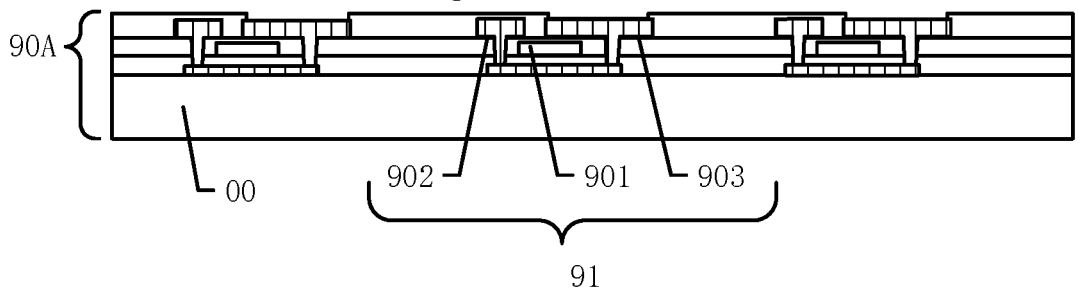
FIGS. 20-23 illustrate semiconductor structures corresponding to certain stages of an exemplary fabrication method in FIG. 19 consistent with disclosed embodiments of the present disclosure.
Figure 21:
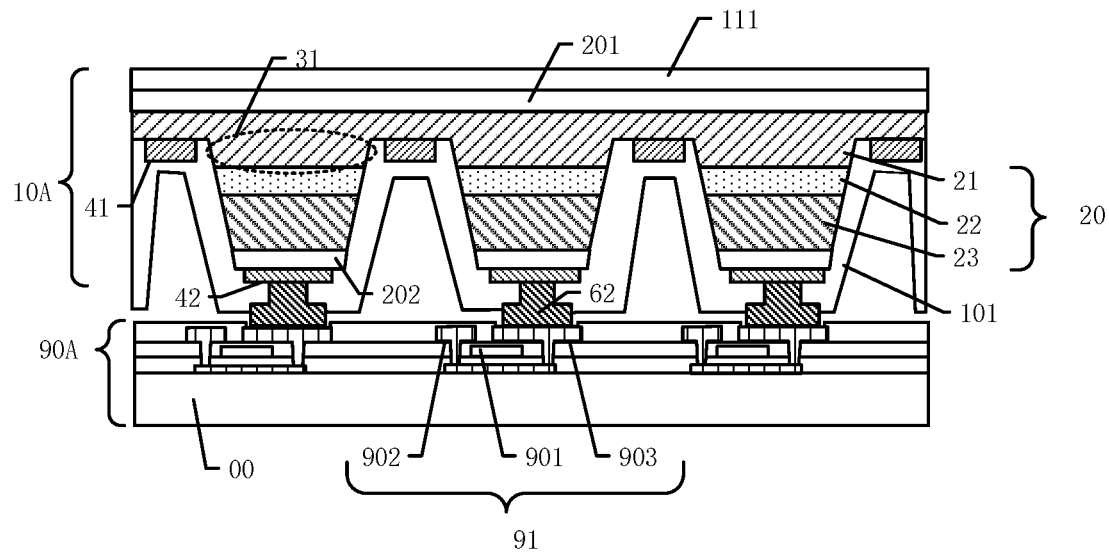
Figure 22:
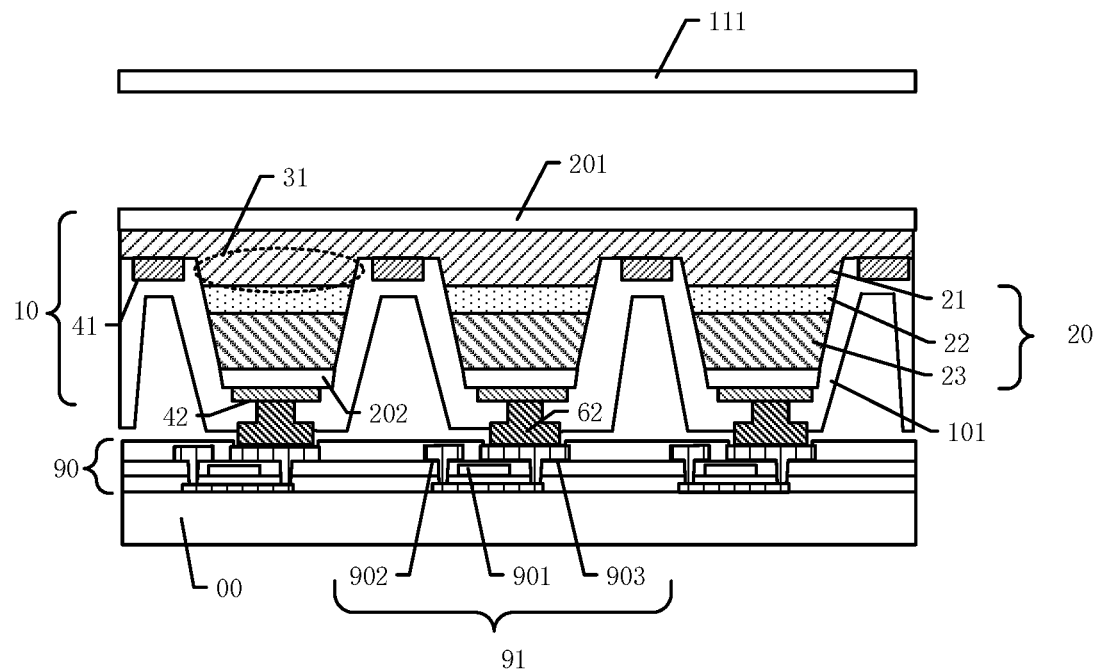

- S7: Providing an array substrate 90A, as illustrated in FIG. 20. The array substrate 90A may include a plurality of thin film transistors 91. A thin film transistor 91 may include a gate 901, a source 902, and a drain 903. In one embodiment, the array substrate 90A may include a first base 00.
- S8: Electrically connecting the drain 903 of the thin film transistor 91 to the P electrode 42 using a hot pressing process, as illustrated in FIG. 21.
- S9: Removing the first base substrate 111, as illustrated in FIG. 22. In one embodiment, the display panel may further include a first current spreading layer 201, a plurality of second current spreading layer 202, and a protection layer 101. In one embodiment, the display panel may further include a plurality of connection parts 62. The drain 903 of the thin film transistor 91 may be electrically connected to the P electrode 42 of the corresponding light-emitting diode 20 through the connection part 62.

In the display panel fabricated by the fabrication method in the disclosed embodiments, the active matrix is used as an example for illustrative purposes. The second substrate 10A and the array substrate 90A may be respectively fabricated, and then the second substrate 10A and the array substrate 90A may be aligned and assembled. Because the second substrate 10A and the array substrate 90A are respectively fabricated, the production efficiency of the display panel may be improved.

Moreover, because the second substrate 10A and the array substrate 90A are aligned and assembled integrally, the transfer process, in which each one light-emitting diode is removed from the original growth substrate, and transported and assembled into the array substrate 90A, may not be desired. Therefore, the fabrication difficulty of the display panel may be reduced, the production cost of the display panel may be reduced, and the production efficiency of the display panel may be improved.

Figure 23:
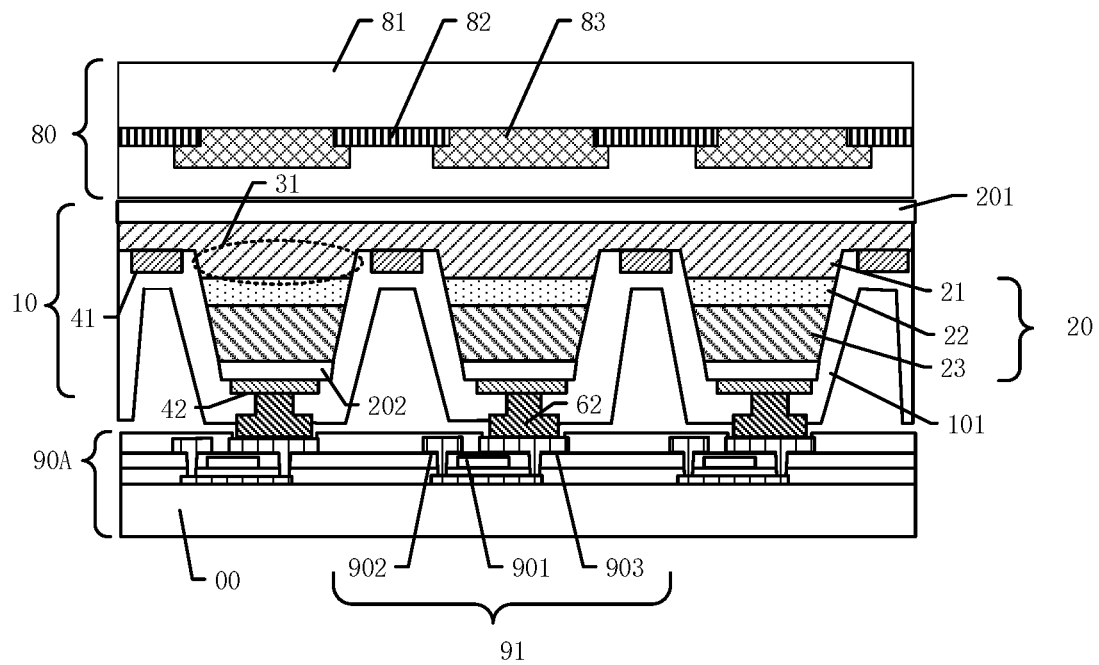

In certain embodiments, referring to FIGS. 2, 19 and 23, the fabrication method in the disclosed embodiments may further include the following.

- S10: Providing a color film substrate 80 on a side of the first N-type semiconductor layer 121 facing away from the array substrate 90A, as illustrated in FIG. 23.

In the display panel fabricated by the fabrication method in the disclosed embodiments, the color film substrate 80 may be disposed. The color film substrate 80 may filter light to enable the display panel to display colored light.

In one embodiment, the color film substrate 80 may include a second base 81, a black matrix 82 disposed on the second base 81, and a wavelength conversion layer 83. In one embodiment, the wavelength conversion layer 83 may be a color resistor, and the color resistor may have a plurality of colors, e.g., red, green, and blue, which are not limited by the present disclosure. The light-emitting diode 20 may be a white light-emitting diode. After being filtered by the color film substrate 80, the light emitted from the light-emitting diode 20 may display variety of colors.

In another embodiment, the wavelength conversion layer 83 may be fluorescent powder or a quantum dot film. The light-emitting diode 20 may be a blue light-emitting diode. The light emitted from the blue light-emitting diode may have a substantially short wavelength and a substantially large energy, and after irradiating on the wavelength conversion layer 83, may excite the fluorescent powder or the quantum dot film to produce colored light of other colors, e.g., red, green, or white light.

Because the light-emitting diodes 20 in the first substrate 10 may emit light of a same color, the fabrication process may be substantially simple. The disposure of the color film substrate 80 in the display panel may implement the color display and reduce the fabrication difficulty of the display panel, thereby improving the production efficiency of the display panel and reducing the production cost of the display panel.

In the display panel in the disclosed embodiments, the plurality of light-emitting diodes may have the island-shaped structures, and the N-type semiconductor layer of the plurality of light-emitting diodes may be integrally disposed. After being fabricated, the first substrate may be integrally assembled into the display panel. Compared with the prior art, the transfer process, in which each one light-emitting diode is removed from the original growth substrate, and transported and assembled into the display panel, may not be desired. Therefore, the production cost of the display panel may be reduced, and the production efficiency of the display panel may be improved. Moreover, in the display panel in the disclosed embodiments, the opaque auxiliary metal electrode may not be desired in the light-emitting diode. Therefore, the light-emitting area of the light-emitting diode may increase, thereby improving the display quality of the display panel. In addition, in the fabrication process of the display panel, the N electrode and the plurality of P electrodes may be formed at the same time by patterning a same one conductive layer. Therefore, the electrode structure of the display panel may be simple, and the fabrication method may be simple and efficient.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments illustrated herein but is to be accorded the widest scope consistent with the principles and novel features disclosed herein.

What is claimed is:

1. A display panel, comprising:
   a display region and a non-display region, wherein the display region includes:
   a first substrate, containing an N-type semiconductor layer including a plurality of protrusions and a plurality of light-emitting diodes, wherein:
      each light-emitting diode includes an island-shaped structure, the island-shaped structure includes a protrusion of the plurality of protrusions of the N-type semiconductor layer, a light-emitting layer over the protrusion, and a P-type semiconductor layer over the light-emitting layer; and
   an N electrode and a plurality of P electrodes, wherein:
      the N electrode has a mesh structure, the island-shaped structure is disposed in a mesh opening of the mesh structure, the N electrode and the island-shaped structure are disposed on a same side of the N-type semiconductor layer, and the N electrode is electrically connected to the N-type semiconductor layer, and
      the plurality of P electrodes are disposed, in a one-to-one correspondence with the plurality of light-emitting diodes, on a side opposite to the N-type semiconductor layer, and each P electrode of the plurality of P electrodes is electrically connected to the P-type semiconductor layer,
   wherein the first substrate further includes a light-shading portion, the light-shading portion includes a plurality of openings, and the island-shaped structure is disposed in an opening of the plurality of openings of the light-shading portion.

2. The display panel according to claim 1, wherein:
   the N electrode includes an oxide layer, wherein the oxide layer is disposed on a surface of the N electrode opposite to the N-type semiconductor layer.

3. The display panel according to claim 1, further including:
   a color film substrate disposed on a side of the first substrate.

4. The display panel according to claim 1, further including:
   a first current spreading layer and a plurality of second current spreading layers, wherein:
      the first current spreading layer is integrally disposed and has a planar shape,
      the plurality of second current spreading layers are independent of each other,
      the first current spreading layer is disposed over a side of the N-type semiconductor layer opposite to the P-type semiconductor layer, and
      each second current spreading layer of the plurality of second current spreading layers is disposed over a side of the P-type semiconductor layer opposite to the N-type semiconductor layer.

5. The display panel according to claim 1, wherein:
   the first substrate further includes a protection layer, wherein the protection layer covers the plurality of island-shaped structures and exposes the plurality of P electrodes.

6. The display panel according to claim 1, wherein:
   the N-type semiconductor layer is made of n-GaN,
   the P-type semiconductor layer is made of p-GaN, and
   the light-emitting layer includes an $In_yGa_{(1-y)}N$ layer and a GaN layer, wherein y=0.015-0.25.

7. The display panel according to claim 1, wherein:
   an area of an orthogonal projection of the island-shaped structure onto the first substrate is S, wherein $25\ \mu m^2 \leq S \leq 10000\ \mu m^2$.

8. The display panel according to claim 1, wherein:
   the N electrode is made of a metal, and
   the P electrode is made of a metal.

9. A display device, comprising: a display panel according to claim 1.

10. A display panel, comprising:
    a display region and a non-display region, wherein the display region includes:
    a first substrate, containing an N-type semiconductor layer including a plurality of protrusions and a plurality of light-emitting diodes, wherein:
       each light-emitting diode includes an island-shaped structure, the island-shaped structure includes a protrusion of the plurality of protrusions of the N-type semiconductor layer, a light-emitting layer over the protrusion, and a P-type semiconductor layer over the light-emitting layer; and
    an N electrode and a plurality of P electrodes, wherein:
       the N electrode has a mesh structure, the island-shaped structure is disposed in a mesh opening of the mesh structure, the N electrode and the island-shaped structure are disposed on a same side of the N-type semiconductor layer, and the N electrode is electrically connected to the N-type semiconductor layer, and the plurality of P electrodes are disposed, in a one-to-one correspondence with the plurality of light-emitting diodes, on a side opposite to the N-type semiconductor layer, and each P electrode of the plurality of P electrodes is electrically connected to the P-type semiconductor layer, wherein:

the first substrate further includes a first auxiliary N electrode, wherein the first auxiliary N electrode and the island-shaped structure are disposed on an opposite side of the N-type semiconductor layer; and the N-type semiconductor layer contains first through-holes, wherein the first auxiliary N electrode is electrically connected to the N electrode through the first through-holes.

11. The display panel according to claim 10, wherein:

an orthogonal projection of the N electrode onto the N-type semiconductor layer have a same shape as an orthogonal projection of the first auxiliary N electrode onto the N-type semiconductor layer.

12. The display panel according to claim 11, wherein:

the first substrate further includes a planar second auxiliary N electrode, wherein the second auxiliary N electrode covers a surface of the first auxiliary N electrode opposite to the N-type semiconductor layer.

13. A display panel, comprising:

a display region and a non-display region, wherein the display region includes:

a first substrate, containing an N-type semiconductor layer including a plurality of protrusions and a plurality of light-emitting diodes, wherein:

each light-emitting diode includes an island-shaped structure, the island-shaped structure includes a protrusion of the plurality of protrusions of the N-type semiconductor layer, a light-emitting layer over the protrusion, and a P-type semiconductor layer over the light-emitting layer; and an N electrode and a plurality of P electrodes, wherein:

the N electrode has a mesh structure, the island-shaped structure is disposed in a mesh opening of the mesh structure, the N electrode and the island-shaped structure are disposed on a same side of the N-type semiconductor layer, and the N electrode is electrically connected to the N-type semiconductor layer, and the plurality of P electrodes are disposed, in a one-to-one correspondence with the plurality of light-emitting diodes, on a side opposite to the N-type semiconductor layer, and each P electrode of the plurality of P electrodes is electrically connected to the P-type semiconductor layer; and a driving array layer including a plurality of thin film transistors, wherein:

a thin film transistor of the plurality of thin film transistors includes a gate, a source, and a drain, the plurality of thin film transistors are electrically connected in a one-to-one correspondence with the plurality of light-emitting diodes, and the drain of the thin film transistor is electrically connected to the P electrode of a corresponding light-emitting diode.

14. The display panel according to claim 13, further including:

a plurality of connection parts, wherein the drain of the thin film transistor is electrically connected to the P electrode of the corresponding light-emitting diode through a connection part of the plurality of connection parts.

15. The display panel according to claim 14, wherein:

the connection part is made of an anisotropic conductive paste.

16. The display panel according to claim 13, wherein:

the first substrate further includes an N-electrode signal bus disposed in the non-display region, wherein the N-electrode signal bus is disposed surrounding the display region and is electrically connected to the N-electrode.

* * * * *